United States Patent [19]

BEST AVAILABLE COPY

Cooper

[11] 3,895,241

[45] July 15, 1975

[54] LED COUPLED SWITCHING CIRCUITS

[75] Inventor: David Cooper, Rancho Palos Verdes, Calif.

[73] Assignee: International Rectifier Corporation, Los Angeles, Calif.

[22] Filed: May 6, 1974

[21] Appl. No.: 466,962

[52] U.S. Cl. ................ 307/311; 250/551; 250/552; 250/209; 250/211 J; 307/117

[51] Int. Cl. ........................ H03k 3/42; H03k 19/14

[58] Field of Search .................... 307/311, 312, 117; 250/551, 552, 208, 209, 211 J

[56] References Cited

UNITED STATES PATENTS 3,693,027 9/1972 Garaway ........................ 307/311 X 3,708,672 1/1973 Marinkovic .................... 250/551 X 3,842,259 10/1974 Bruning ......................... 307/311 X

*Primary Examiner*—Siegfried H. Grimm

*Attorney, Agent, or Firm*—Ostrolenk, Faber, Gerb & Soffen

[57] ABSTRACT

LED coupled switching circuits are provided with at least two solid state light-emitting source devices which activate corresponding light-responsive switching devices to produce outputs related to the state of excitation of the solid state light sources. At least one of the light-responsive switching devices in the output circuit is connected in Darlington type arrangements with a power transistor.

8 Claims, 2 Drawing Figures

LED COUPLED SWITCHING CIRCUITS

BACKGROUND OF THE INVENTION

This invention relates to a switching circuit for producing an output signal in response to one or more input signals wherein the input signals are fully isolated from the output devices through the use of light-emitting devices which operate light-responsive switching circuits.

The use of optical isolation techniques is well known in the control circuit art, wherein a light-emitting device of any desired construction is optically coupled to a light-responsive device such as a photodiode, phototransistor, photothyristor or the like.

In the past, the output switching circuit containing the light-responsive device has incorporated compound-connected transistors in the form generally known as a Darlington type circuit, where two transistors are connected in a compound connection to form a single three terminal unit with the power output stage having extremely low distortion. These circuits, however, have been used simply for on-off switching arrangements and, where more than one such circuit would be desired, one skilled in the art would duplicate the entire circuit to form the necessary parallel stages.

BRIEF SUMMARY OF THE INVENTION

In accordance with the present invention, a novel LED coupled switching circuit is provided wherein a plurality of light-emitting devices are used as optical inputs to a corresponding plurality of light-sensitive devices such as phototransistors or photothyristors, or the like, where the plural photosensitive devices in the output circuit contain a single compound connection of Darlington arrangement in order to produce output signals related to the state of the input signals applied to the plural input LED devices. Thus, common components are used in the output signal to avoid the need for duplicating a plurality of separate Darlington circuit arrangements, one for each of the input LED devices.

DETAILED DESCRIPTION OF THE INVENTION

Figure 1:
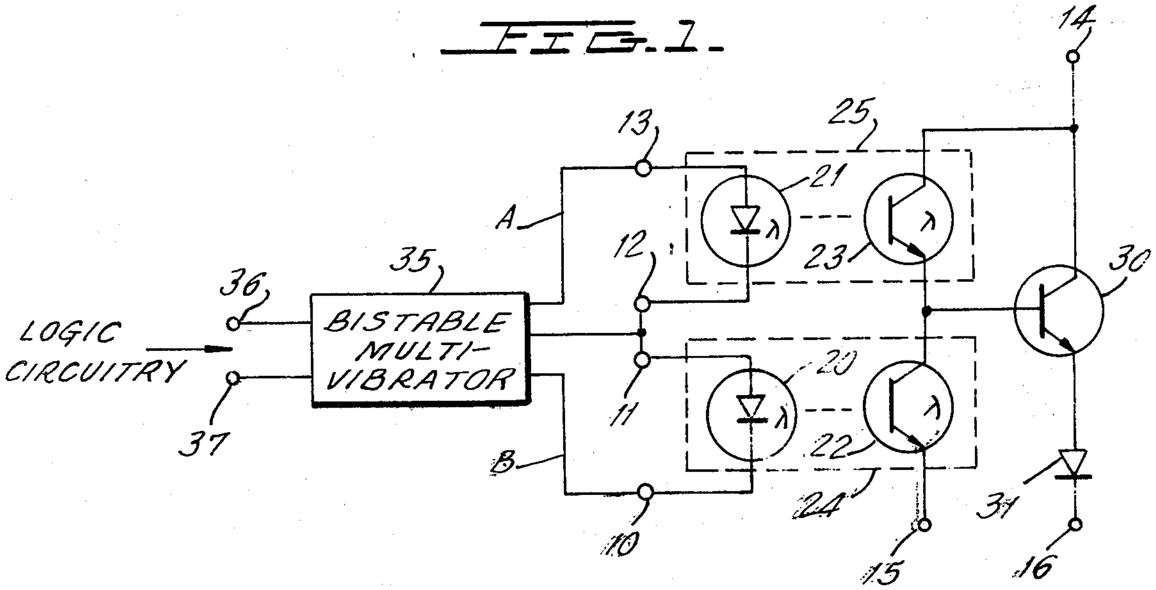
FIG. 1 shows a diagram of the circuit of the invention wherein two light-sensitive transistors are provided to drive an output circuit which contains a common basic Darlington pair.

Referring first to FIG. 1, there is illustrated a circuit diagram of a plurality of semiconductor devices which can be separate devices interconnected on a common circuit board, or which could be a hybrid arrangement of semiconductors formed in one or more common wafers. Whether the device is made of discrete components, or in hybrid or in integrated circuit fashion, however, the device will have seven terminals, 10 to 16, wherein terminals 10 to 13 are input terminals, while terminals 14, 15 and 16 are output terminals and are connectable to various power supplies and the like.

Terminals 10 and 11 are connected directly across a light-emitting diode 20 while terminals 12 and 13 are connected directly across a light-emitting diode 21. Note that terminals 11 and 12 can be a common terminal but they are preferably separated if the user of the circuit wishes to have isolation between the single inputs to the light-emitting diodes 20 and 21.

The light-emitting diode 20 is then optically coupled to phototransistor 22 which is an NPN transistor and similarly light-emitting diode 21 is optically coupled to NPN phototransistor 23. Note that devices 20 and 22 may be contained in a common housing shown schematically by dotted lines 24, while devices 21 and 23 may also be contained in a common housing schematically shown by dotted lines 25.

A main power transistor 30 which is also an NPN transistor then has its collector connected to terminal 14 and its emitter connected through diode 31 to terminal 16. Note that the emitter of phototransistor 22 is connected to terminal 15. Any desired driving circuit can now be connected to the terminals 10 to 16 in order to obtain outputs at terminals 15 and 16 related to various inputs at terminals 10 to 13.

The basic circuit configuration of phototransistor 23 which is a signal transistor and of power transistor 30 is that of the conventional Darlington pair where, however, the signal transistor 23 is a light-sensitive transistor.

The circuit differs from the conventional Darlington pair by the provision of the phototransistor 22 connected to the junction between the emitter of transistor 23 and the base of transistor 30.

One manner in which the basic circuit of FIG. 1 can be driven is schematically illustrated in FIG. 1 by the connection of the bistable multivibrator 35 having outputs A and B to the terminals 10 to 13. The bistable multivibrator 35 can then be switched from logic output A positive to the logic output B positive by appropriate input signals to the bistable terminals 36 and 37 from conventional logic circuitry.

Assuming that the bistable is in logic output A positive, the light-emitting diode 21 would be energized, thereby to apply light energy to the light-sensitive base of signal phototransistor 23. This then turns on phototransistor 23 (assuming that appropriate biasing voltages are connected between terminals 14, 15 and 16) and the main power transistor 30 will then also switch on. Note that the light-emitting diode 20 is not energized so that the transistor 22 does not conduct.

If now the bistable multivibrator switches to a B position output, the light-emitting diode 20 would switch on, thereby to energize the light-sensitive base of phototransistor 22. The phototransistor 22 would then turn on, thereby being capable, for example, of reducing the bias on the base of transistor 30 to turn transistor 30 off.

Any number of various kinds of driving circuits for operating the basic circuit component configuration of FIG. 1 will now suggest themselves to those skilled in the art.

It will be noted that the circuit of FIG. 1 contains a diode 31 between the emitter of transistor 30 and the terminal 16. The basic circuit configuration can operate satisfactorily without the diode 31. However, the diode 31 provides certain additional advantages to the circuit user. Thus, depending upon the potential at which the emitter of phototransistor 22 is connected, the diode 31 can back-bias the emitter-to-base junction of power transistor 30 and thus minimize power dissipation in transistor 30 if the emitter-to-base junction of transistor 30 exhibited an avalanche condition.

Figure 2:
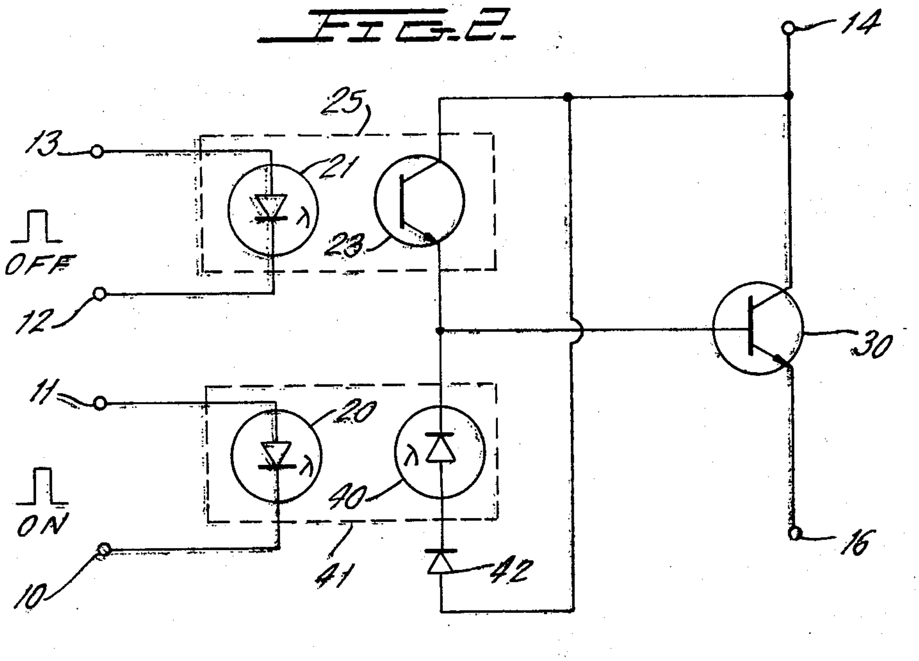
FIG. 2 is a circuit diagram of a second embodiment of the invention wherein one of the light-sensitive switching devices in the output circuit is a photosensitive thyristor, and wherein the input signals to the light-emitting devices are in pulse form.

Referring next to FIG. 2, similar components are used in the circuit of FIG. 2 to those in the circuit of FIG. 1 and again these components could be developed in either a discrete fashion, a hybrid fashion or in an integrated circuit fashion. Thus, a common circuit is provided with six terminals 10, 11, 12, 13, 14 and 16. Note that terminal 15 of FIG. 1 is not used in the configuration of FIG. 2.

The terminals 10 and 11 are again connected to light-emitting diode 20 while terminals 12 and 13 are connected to light-emitting diode 21. Further, the light-emitting diode 21 is optically coupled to phototransistor 23 and the terminals 14 and 16 are connected to the collector and emitter electrodes of power transistor 30.

The basic component configuration of FIG. 2 differs from that of FIG. 1 in that a photosensitive thyristor 40 and diode 42 are used in place of transistor 22 of FIG. 1. Thyristor 40 is optically coupled to the light-emitting device 20. Components 20 and 40 could be in a common housing, as shown by dotted lines 41.

The devices used in the circuit of FIG. 2 lend themselves to various types of input and output configurations but retain the basic use of the Darlington pair consisting of transistors 23 and 30 in the output circuit.

The circuit of FIG. 2 operates as a pulse turn-on pulse turn-off circuit arrangement when appropriate pulse sources are connected to terminals 10 to 13 and an appropriate biasing circuit and load circuit are connected to terminals 14 and 16. In the circuit of FIG. 2, a first pulse applied to terminals 12 and 13 causes application of power from a source connected at terminal 14 to a load connected at terminal 16. A second pulse connected to terminals 10 and 11 will remove the power from terminal 16.

In operation, when a suitable pulse is applied to terminals 10 and 11 of FIG. 2, the light-emitting diode 20 emits light to enable the firing or conduction of photosensitive thyristor 40. The conduction of photothyristor 40 supplies base drive to power transistor 30 so that power may now be transferred from suitable voltage supplies connected to terminal 14 to a load connected to terminal 16. Moreover, once the photothyristor 40 is fired, it latches on, thereby holding transistor 30 in its conductive condition so long as thyristor 40 conducts. Thus, even though the signal applied to terminals 10 and 16 is a pulse (schematically illustrated in FIG. 2), the thyristor 40 continues to conduct after the pulse decays to maintain power transistor 30 conductive between its collector and emitter electrodes.

In order to shut off the power transistor 30, a pulse signal is connected to terminals 12 and 13 as schematically illustrated. This pulse signal creates a light pulse from LED 21 which activates signal phototransistor 23 in the Darlington pair. This causes transistor 23 to conduct between its collector and emitter terminals, thereby bypassing the diode 42 and photothyristor 40 for a sufficient time to allow the photothyristor 40 to recover its forward blocking capability. It should be noted that the off pulses applied to terminals 12 and 13 should be longer than the recovery time necessary for photothyristor 40 to recover its forward blocking characteristics. Once thyristor 40 recovers its forward blocking capability and the signal-to-light emitter diode 21 is removed, the transistor 23 becomes nonconductive. This removes the base signal to transistor 30 and the main power circuit between terminals 14 and 16 becomes nonconductive.

Any number of various circuit configurations which can use the basic circuit of FIG. 2 will further suggest themselves to those skilled in the art.

Although this invention has been described with respect to preferred embodiments, it should be understood that many variations and modifications will now be obvious to those skilled in the art and, therefore, the scope of this invention is to be limited, not by the specific disclosure herein, but only by the appended claims.

I claim:

1. A switching circuit comprising, in combination: first and second light-emitting devices having first and second sets of terminals; first and second photoresponsive semiconductor devices optically coupled to said first and second light-emitting devices respectively; said first and second photoresponsive semiconductor devices being operable between conductive and nonconductive conditions in response to light output variations from their said respective first and second light-emitting devices; said first photoresponsive semiconductor device comprising a first phototransistor having emitter and collector electrodes; and a power transistor having emitter, collector and base electrodes; said first phototransistor and said power transistor connected in a Darlington configuration, whereby their said collector electrodes are connected to one another, and whereby the emitter electrode of said first phototransistor is connected to the base of said power transistor; said second photoresponsive semiconductor device having first and second electrodes connected in series with said collector and emitter electrodes of said first phototransistor; said first electrode of said second photoresponsive semiconductor device connected to said base electrode of said power transistor.

2. The circuit of claim 1 wherein said second photoresponsive semiconductor device is a second phototransistor.

3. The circuit of claim 1 wherein said second photoresponsive semiconductor device is a thyristor.

4. The circuit of claim 1 wherein said phototransistor is an NPN transistor.

5. The circuit of claim 2 wherein said phototransistors are NPN transistors.

6. The circuit of claim 3 which further includes a diode connected in series with said thyristor.

7. The circuit of claim 1 which further includes a diode connected in series with said power transistor.

8. The circuit of claim 6 wherein said thyristor and said diode are connected in closed series relation with said first phototransistor.

* * * * *